(12) United States Patent
Tanahashi et al.

(10) Patent No.: US 6,488,781 B1
(45) Date of Patent: Dec. 3, 2002

(54) SOLDERING PASTE, SOLDERING METHOD, AND SURFACE-MOUNTED TYPE ELECTRONIC DEVICE

(75) Inventors: Akira Tanahashi, Okazaki (JP); Norihisa Imaizumi, Hoi-gun (JP); Seiji Shibata, Iruma (JP); Eiichi Sudo, Aichi-gun (JP)

(73) Assignees: Denso Corporation, Kariya (JP); Tamura Kaken Corporation, Saitama (JP)

( * ) Notice: Subject to any disclaimer, the term of this patent is extended or adjusted under 35 U.S.C. 154(b) by 0 days.

(21) Appl. No.: 09/384,226

(22) Filed: Aug. 27, 1999

(30) Foreign Application Priority Data

Aug. 27, 1998 (JP) .......................................... 10-241863

(51) Int. Cl.$^7$ .......................... B23K 35/22; C23L 18/00; C23L 30/00
(52) U.S. Cl. .............................. 148/22; 148/23; 148/24; 148/527; 219/85.2; 75/228
(58) Field of Search .......................... 148/23, 516, 527, 148/537, 24, 25, 22; 228/207, 214, 223, 224; 219/85.2; 257/772; 403/272; 413/21; 438/612; 75/303, 328, 228, 245, 246, 247; 106/1.05, 248.3; 428/457; 427/331, 355, 367, 369, 370, 375, 377, 383.1

(56) References Cited

U.S. PATENT DOCUMENTS

| | | | |
|---|---|---|---|
| 4,460,414 A | | 7/1984 | Hwang |
| 4,541,876 A | * | 9/1985 | Hwang ........................ 148/22 |
| 4,919,729 A | | 4/1990 | Elmgren et al. |
| 4,995,921 A | | 2/1991 | Davis et al. |
| 5,004,508 A | | 4/1991 | Mace et al. |
| 5,004,509 A | | 4/1991 | Bristol |
| 5,011,546 A | * | 4/1991 | Frazier et al. ................. 148/23 |
| 5,064,480 A | | 11/1991 | Dershem et al. |
| 5,092,943 A | * | 3/1992 | Davis et al. .................... 148/23 |
| 5,125,560 A | | 6/1992 | Degani et al. |
| 5,150,832 A | * | 9/1992 | Degani et al. ............... 228/224 |
| 5,196,070 A | | 3/1993 | Ables et al. |
| 5,211,763 A | | 5/1993 | Takamoto et al. |
| 5,334,261 A | | 8/1994 | Minahara et al. |
| 5,484,979 A | * | 1/1996 | Gao ....................... 219/121.64 |
| 5,851,311 A | * | 12/1998 | Diamant et al. ............... 148/23 |
| 5,904,782 A | * | 5/1999 | Diep-Quang .................. 148/23 |
| 5,919,317 A | * | 7/1999 | Tanahashi et al. ............. 148/24 |
| 6,135,344 A | * | 10/2000 | Sakuyama et al. ........ 228/234.1 |

FOREIGN PATENT DOCUMENTS

| | | |
|---|---|---|
| EP | 0 077 622 | 4/1983 |
| JP | 63-299888 | 12/1968 |
| JP | 58-209497 | 12/1983 |
| JP | 59-153595 | 9/1984 |
| JP | 62-6795 | 1/1987 |
| JP | 63-33196 | 2/1988 |
| JP | 64-5039 | 1/1989 |
| JP | 64/18600 | 1/1989 |
| JP | 2-290693 | 11/1990 |
| JP | 3-94995 | 4/1991 |

(List continued on next page.)

Primary Examiner—Deborah Jones
Assistant Examiner—Michael LaVilla
(74) Attorney, Agent, or Firm—Harness, Dickey & Pierce, PLC

(57) ABSTRACT

Soldering paste for bonding an electronic component to electrodes on a ceramic substrate includes alcohol having at least two OH groups, organic acid, and metallic powder. The electronic component disposed on the electrodes through the soldering paste undergoes a reflow performed in a nitrogen atmosphere. Accordingly, an ester film is formed around the electrodes as a reaction product of the organic acid and the alcohol. The ester film incorporates therein the remaining organic acid and metal salt as its reaction product. As a result, high insulation reliability is provided.

14 Claims, 5 Drawing Sheets

FOREIGN PATENT DOCUMENTS

| | | |
|---|---|---|
| JP | 3-106594 | 5/1991 |
| JP | 4-135092 | 5/1992 |
| JP | 5-42388 | 2/1993 |
| JP | 5-69188 | 3/1993 |
| JP | 5-69189 | 3/1993 |
| JP | 5-177385 | 7/1993 |
| JP | 5-185282 | 7/1993 |
| JP | 5-185285 | 7/1993 |
| JP | 5-200585 | 8/1993 |
| JP | 6-71481 | 3/1994 |
| JP | 6-87090 | 3/1994 |
| JP | 6-136299 | 5/1994 |

\* cited by examiner

SOLDERING PASTE, SOLDERING METHOD, AND SURFACE-MOUNTED TYPE ELECTRONIC DEVICE

CROSS REFERENCE TO RELATED APPLICATION

This application is based upon and claims the benefit of priority of the prior Japanese Patent Application No. 10-241863 filed on Aug. 27, 1998, the contents of which are incorporated herein by reference.

BACKGROUND OF THE INVENTION

1. Field of the Invention

The present invention is related to soldering paste, a soldering method, and a surface-mounted type electronic device.

2. Related Arts

When a conventional flux containing rosin as a base and aminohalogen salt as an activator is used for soldering paste, the base and the activator remain after reflow. This gives rise to problems that (i) an insulation property between electrodes is insufficient when a narrow electrode distance of approximately 100 $\mu$m is taken, (ii) corrosion occurs when a mounted component is used in an environment permitting contact with air, and (iii) silicone gel is not hardened when the mounted component is sealed therewith.

To solve these problems, Japanese Patent Application Laid-Open No. 9-94691 proposes a volatile polyhydric alcohol material having two or more OH groups as a base of flux for soldering paste. In this case, when specific alcohol is selected as the polyhydric alcohol, satisfactory wettability can be secured by reducibility of this material without adding an activator. Under these circumstances, there is a requirement of further improving continuous printability.

SUMMARY OF THE INVENTION

The present invention has been made in view of the above-mentioned problems. An object of the present invention is to improve printability of soldering paste without lowering wettability and insulation reliability. Another object of the present invention is to provide a soldering method for soldering an electronic component to a base member using soldering paste with high printability and wettability. Still another object of the present invention is to provide a surface-mounted type electronic device including an electronic component surface-mounted on a base member with high insulation reliability.

According to a first aspect of the present invention, a soldering paste is composed of a flux including alcohol as a base and organic acid as an activator, and metallic powder. The alcohol has at least two OH groups. The organic acid reacts with the alcohol to produce ester when the metallic powder is fused. Preferably, the soldering paste includes a material for reducing a viscosity of the soldering paste.

According to a second aspect of the present invention, a soldering method for soldering an electronic component to a base member uses soldering paste including alcohol which has at least two OH groups, organic acid, and metallic powder. The electronic component is soldered to the base member by the soldering paste during a soldering reflow.

According to a third aspect of the present invention, a surface-mounted type electronic device includes an electronic component bonded to an electrode through a soldering portion, and an ester film disposed on a peripheral surface of the electrode. The ester film is a reaction product between an organic acid and an alcohol and including the organic acid therein.

The addition of the organic acid to the soldering paste allows the addition of the material to the soldering paste for reducing the viscosity of the soldering paste. As a result, the printability of the soldering paste is improved without lowering the wettability. Further, the organic acid reacts with alcohol in the soldering paste to produce an ester film using metallic powder as a catalyst during soldering reflow. The ester film incorporates therein remaining organic acid and metal salt as its reaction product. As a result, insulation reliability is improved.

BRIEF DESCRIPTION OF THE DRAWINGS

These and other objects and features of the present invention will become more readily apparent from a better understanding of a preferred embodiment described below with reference to the following drawings.

DETAILED DESCRIPTION OF THE PREFERRED EMBODIMENT

A method for producing a surface-mounted type electronic device in a preferred embodiment according to the present invention is described referring to FIGS. 1 to 4.

Figure 1:
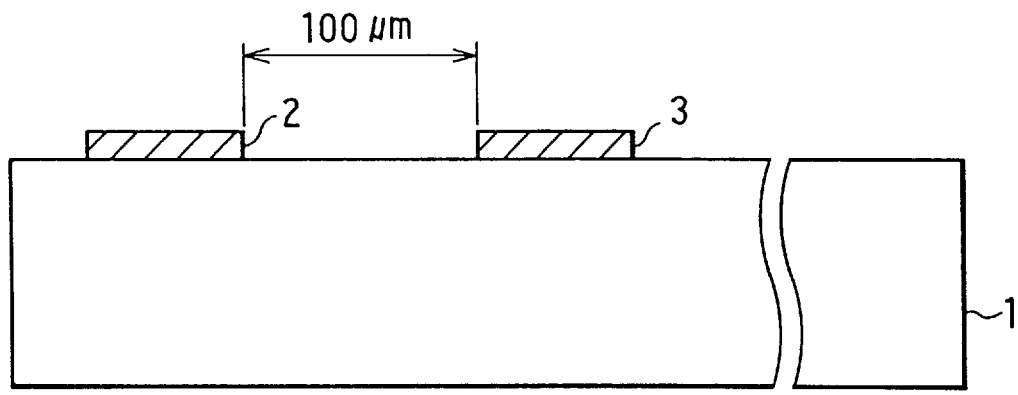
FIG. 1 is a cross-sectional view for explaining a process of manufacturing a surface-mounted type electronic device in a preferred embodiment of the present invention.

First, as shown in FIG. 1, a wiring pattern is formed on an upper surface of a ceramic substrate 1. In FIG. 1, electrodes (lands) 2, 3 in the wiring pattern are positioned with a distance therebetween of approximately 100 $\mu$m. The wiring pattern (electrodes 2, 3) is made of Cu (copper) or Ag (silver).

Figure 2:
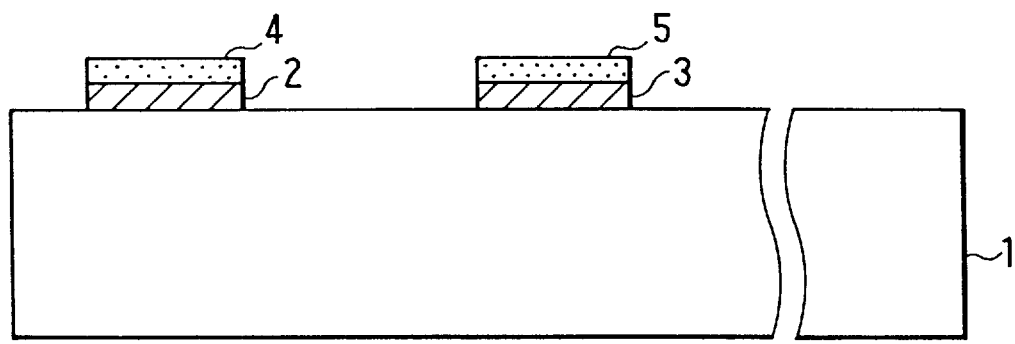
FIG. 2 is a cross-sectional view for explaining the process of manufacturing the surface-mounted type electronic device.

As shown in FIG. 2, soldering paste is printed on the electrodes 2, 3 of the wiring pattern through a mesh screen to soldering paste portions 4, 5. The soldering paste includes alcohol having two or more OH groups as a base of flux, organic acid as an activator of the flux and metallic powder as soldering power. The metallic powder includes at least Sn. The alcohol is trihydric alcohol such as trimethylolpropane or trimethylolethane.

TABLE 1

| No. | Organic acid | Melting point (° C.) | [Evaporation temperature] Temperature at TG % = 0% |
|---|---|---|---|
| 1 | Benzoic acid | 124 | 186 |
| 2 | o-methylbenzoic acid | 106 | 190 |
| 3 | p-methylbenzoic acid | 181 | 207 |
| 4 | p-ethylbenzoic acid | 115 | 218 |
| 5 | 2-ethoxybenzoic acid | 19 | 230 |
| 6 | p-tert-butylbenzoic acid | 167 | 230 |
| 7 | 4-n-hexylbenzoic acid | 98 | 248 |
| 8 | 1-naphthoic acid | 161 | 252 |
| 9 | 2,4,6-trimethylbenzoic acid | 155 | 210 |
| 10 | m-methylbenzoic acid | 110 | 198 |
| 11 | Lauric acid | 48 | 223 |

The organic acid includes at least one selected from materials shown in Table 1, i.e., from benzoic acid, o-methylbenzoic acid, p-methylbenzoic acid, p-ethylbenzoic acid, 2-ethoxybenzoic acid, p-tert-butylbenzoic acid, 4-n-hexylbenzoic acid, 1-naphthoic acid, 2,4,6-trimethylbenzoic acid, m-methylbenzoic acid and lauric acid. When the electrodes are made of Ag, the organic acid includes at least one selected from benzoic acid, p-methylbenzoic acid, o-methylbenzoic acid and p-ethylbenzoic acid.

Figure 3:
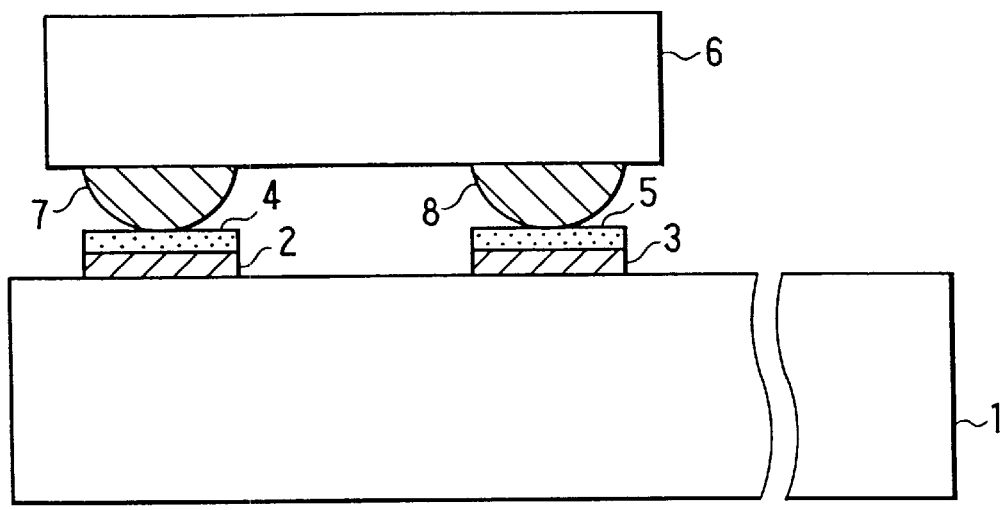
FIG. 3 is a cross-sectional view for explaining the process of manufacturing the surface-mounted type electronic device.

Further, as shown in FIG. 3, an electronic component 6 is disposed on the ceramic substrate 1 so that electrodes (bumps) 7, 8 thereof are brought into contact with the soldering paste portions 4, 5. Then, soldering reflow is carried out within a reflow oven in nitrogen atmosphere at a reflow peak temperature of from 230° C. to 240° C. Thus, the soldering reflow should be carried out in non-reductive atmosphere such as air atmosphere, inert gas ($N_2$, Ar or the like) atmosphere or specific hydrogen atmosphere. For example, the specific hydrogen atmosphere includes hydrogen at a temperature lower than 300° C.

Figure 4:
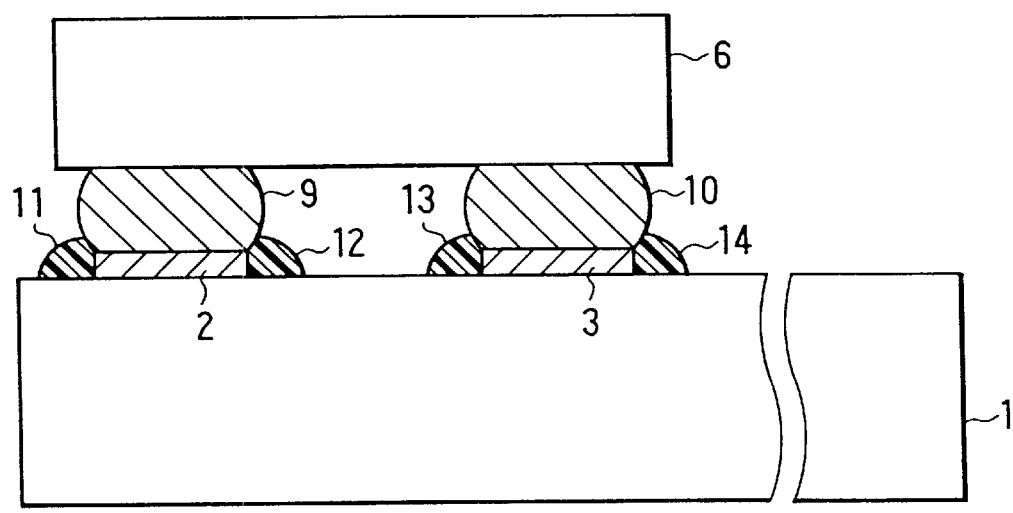
FIG. 4 is a cross-sectional view for explaining the process of manufacturing the surface-mounted type electronic device.

As shown in FIG. 4, the electrodes 2, 3 of the wiring pattern and the electronic component 6 are soldered to each other with soldering portions 9, 10 interposed therebetween by the reflow. In more detail, when the electronic component 6 is soldered to the electrodes 2, 3 on the substrate 1, esterification occurs between the organic acid and the alcohol in the soldering paste portions 4, 5 to produce ester, and remaining organic acid and metal salt as its reaction product are incorporated into the ester. That is, ester films 11, 12, 13, 14 are formed on the peripheral portions of the electrodes 2, 3 on the ceramic substrate 1, and incorporate therein the organic acid and the metal salt during the soldering reflow. Accordingly, high insulation reliability is secured.

The flux composition of the soldering paste portions 4, 5 in FIG. 2 is described below in comparison with that described in Japanese Patent Application Laid-Open No. 9-94691.

In Japanese Patent Application Laid-Open No. 9-94691, flux of soldering paste includes a polyhydric alcohol material having two or more OH groups as a base. In the present embodiment, a volatile terpene compound is, besides the material described above, added to the soldering paste as a viscosity controlling component for further improving continuous printability of the soldering paste. The viscosity controlling component decreases the viscosity of the soldering paste. Generally, since such a viscosity controlling component lacks reducibility, wettability for soldering is decreased. In order to compensate the decrease in the wettability, that is, to compensate the decrease in the reducibility, for example, p-tert-butylbenzoic acid (BBA) is further added to the paste with a content of 5% as the activator. It is identified that when the organic acids in Table 1, other than BBA, are added to the paste, the same effect is also provided. Such paste was applied to a product having electrodes made of Cu, and a comb-shaped electrode test with an electrode distance of 100 $\mu$m was carried out to the product. As a result, stable insulation reliability was confirmed.

Next, the reason for using the organic acid as the activator is described in more detail.

Figure 5:
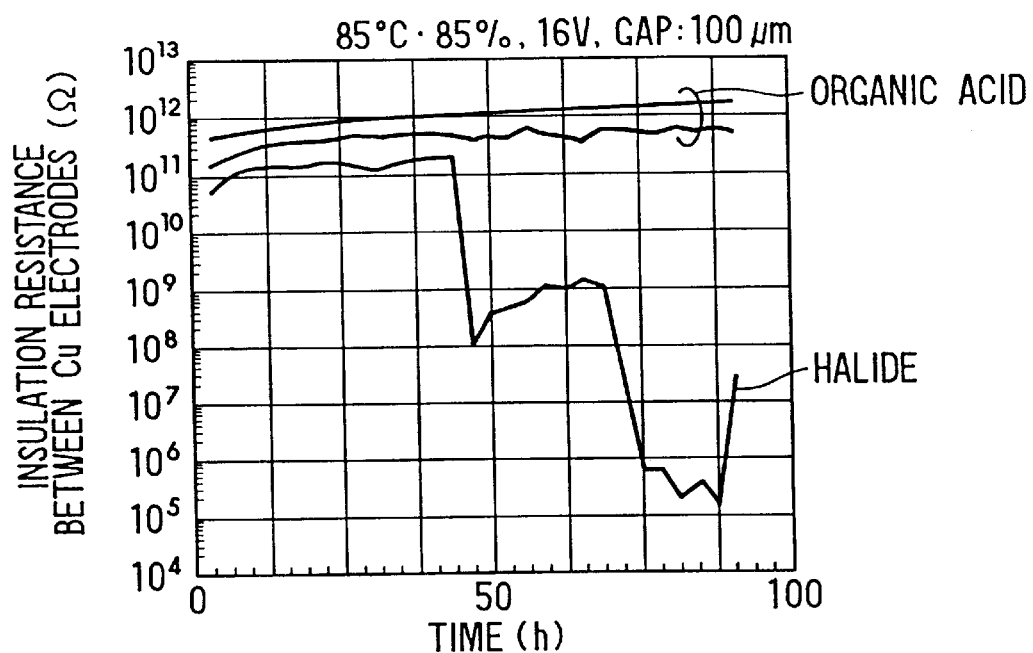
FIG. 5 is a graph showing changes in an insulation resistance between copper electrodes in accordance with elapsed time.

Generally, a large number of materials such as halogen, amine, organic acid, amine salt, organic acid salt and phosphoric acid can be used as activators for the soldering paste. In these activators, there arises a difference in insulation reliability between the organic acid and the other activators when they have similar wettabilities. For example, FIG. 5 shows a change in an insulation resistance between copper electrodes according to elapsed time, when two types of organic acids and halide are used. The measurement was carried out by applying a bias voltage of 16 v across the electrodes with an electrode distance of 100 $\mu$m at 85° C. and 85%. As understood from FIG. 5, in case of using halide, the insulation resistance was abruptly decreased when 45 hours elapsed. In a case of using organic acids, the insulation resistance hardly decreased. This effect can be explained as follows.

Figure 6:
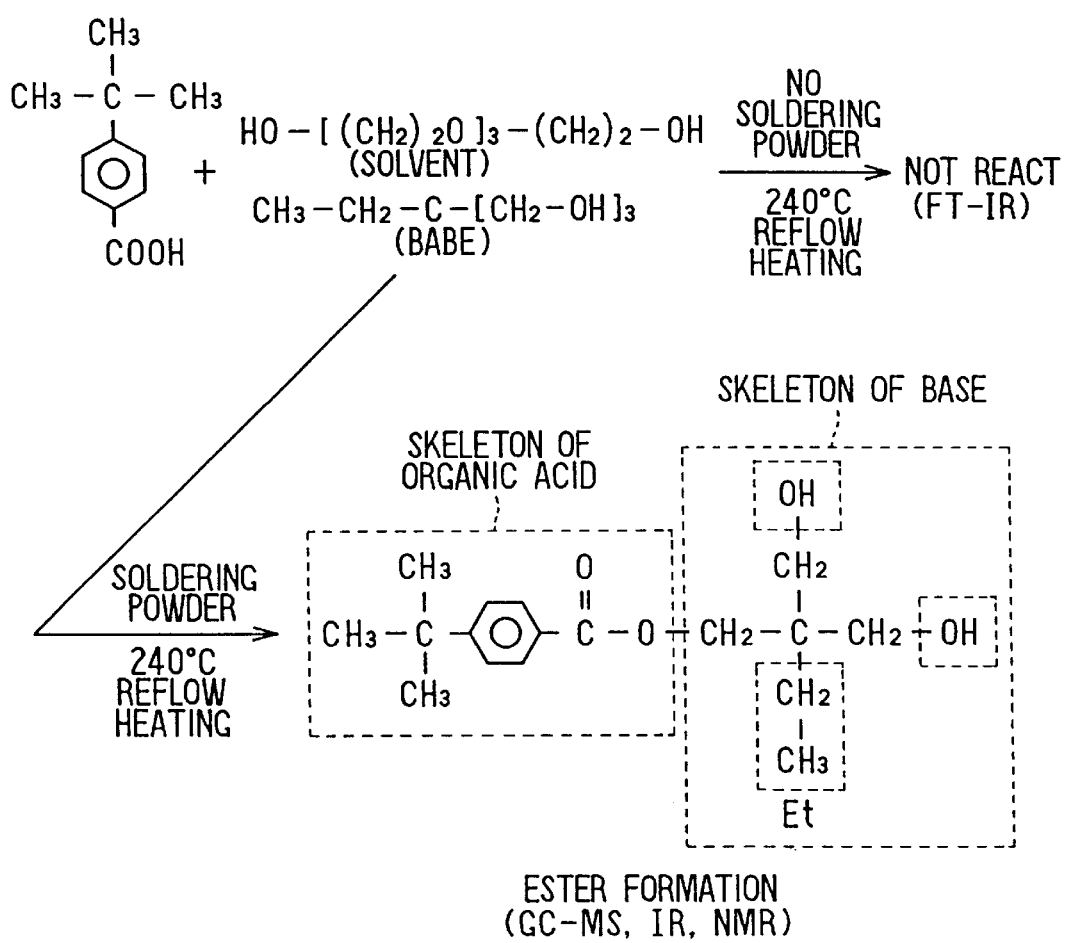
FIG. 6 is a chart showing a chemical formula for producing ester.

The soldering paste further contains polyhydric alcohol having two or more OH groups as the base. Therefore, as shown in FIG. 6, for example, when p-tert-butylbenzoic acid is added as the organic acid activator, it deoxidizes metal oxide during the reflow (heating at 240° C. in an atmosphere of $N_2$ under the presence of the soldering powder), and at the same time reacts with trimethylolpropane (TMP), which is added as the base, using metal oxide powder as a catalyst, thereby forming ester. As this ester, three types of esters, namely, mono-, di- and tri-esters can be formed. The ester incorporates therein the organic acid remaining after its esterification and the metal salt as the reaction product. This is clarified from the results of experiments and analysis.

In an open system in which no metallic powder is added (ordinary reflow), as shown in FIG. 6, no ester is produced. The ester is detected under the presence of the soldering powder. It is further found that the esterification proceeds easier with trihydric alcohol such as TMP than with dihydric alcohol such as tetraethylene glycol. In addition to TMP, trimethylolethane, glycerol, and the like are effective as the base to form ester.

Figure 7:
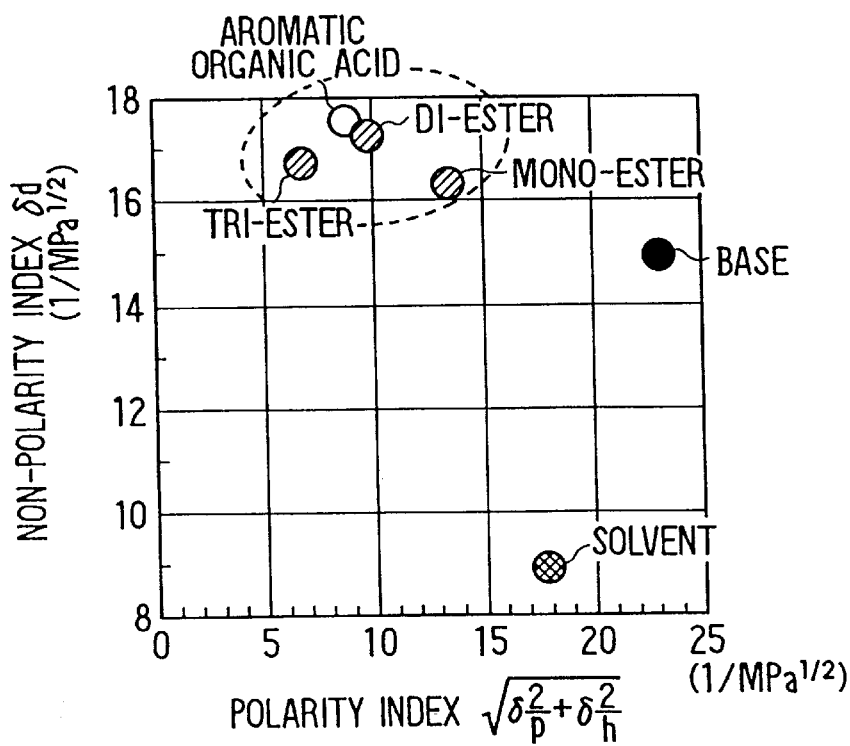
FIG. 7 is a graph showing results obtained by calculating compatibility parameters of Hansen.

Triesters have a skeleton of organic acid as is apparent from FIG. 7, and incorporates therein organic acid quite easily. This is clarified by calculating compatibility parameters of Hansen. FIG. 7 is a graph for identifying solubility using an SP theory of Hansen. It is understood from FIG. 7 that a distance of indexes between organic acid and each ester (mono-, di- or tri-ester) is short. This implies that they are easily incorporated with one another. Therefore, when organic acid is added to the paste containing polyhydric alcohol as the base, a part of the organic acid reacts with the alcohol to form ester using the soldering powder as a catalyst during the reflow, and residual organic acid and organic acid salt are incorporated in the ester. The ester itself functions as a protective film. This protective film is effective for preventing deterioration of the insulation reliability under a high-temperature and high-humidity environment.

Incidentally, when a halogen material or an amine material is added to the soldering paste as an activator in place of the organic acid, insulation reliability is decreased. This is because the activator cannot produce a protection film that incorporates therein its residue and its reaction product (metal salt), so that the activator itself and the reaction product lowers the insulation property in cooperation with moisture.

Preferable organic acid can be selected by a thermal analysis using a TG (thermal gravimetry) method. The TG method is carried out under conditions that a flow rate of air or nitrogen gas is 200 ml/min and a temperature rise rate is 10° C./min (conditions described in Japanese Patent Application Laid-Open No. 9-94691). As a result of this thermal analysis, it is advisable to select organic acid having characteristics that the temperature at which weight % thereof is approximately 0% (temperature at TG%=0%) is higher than a solidus temperature of the soldering powder and lower than the reflow peak temperature.

Further, an ester compound is generally hydrolyzed. Therefore, it was examined whether ester produced by TMP and organic acid was hydrolyzed under usage conditions. The results are described below.

A quantitative analysis was carried out by GC-MS when 100 hours elapsed at 85° C. and 85%. As a result, as indicated by the following chemical formula, hydrolyzed organic acid was not detected from residues collected from between the electrodes. This result reveals that the ester compound is hardly hydrolyzed under the usage conditions.

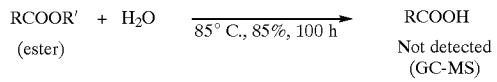

Next, an example of mounting an HIC product having an Ag wiring is described.

Figure 8:
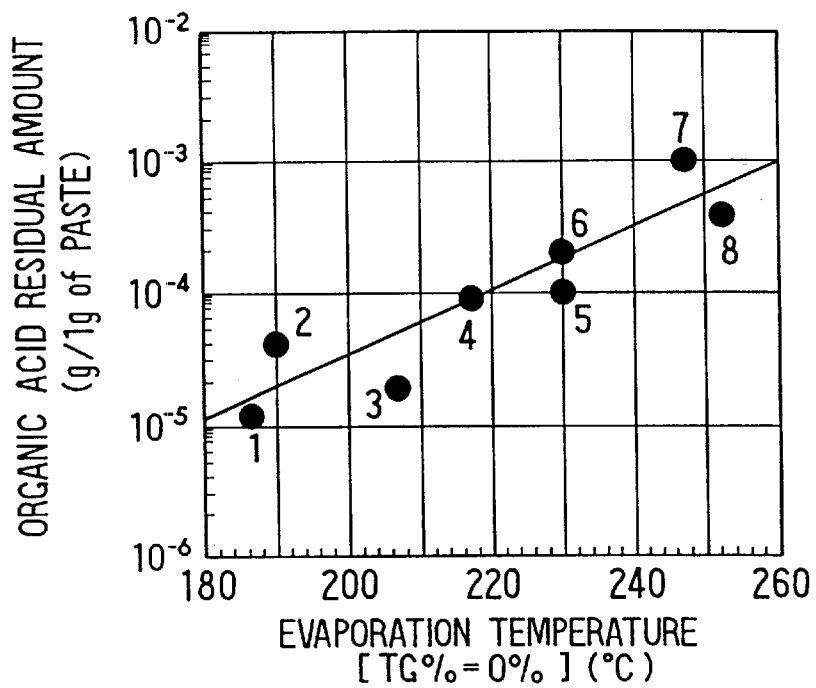
FIG. 8 is a graph showing residual amounts of organic acid relative to an evaporation temperature (TG%=0%)
Figure 9:
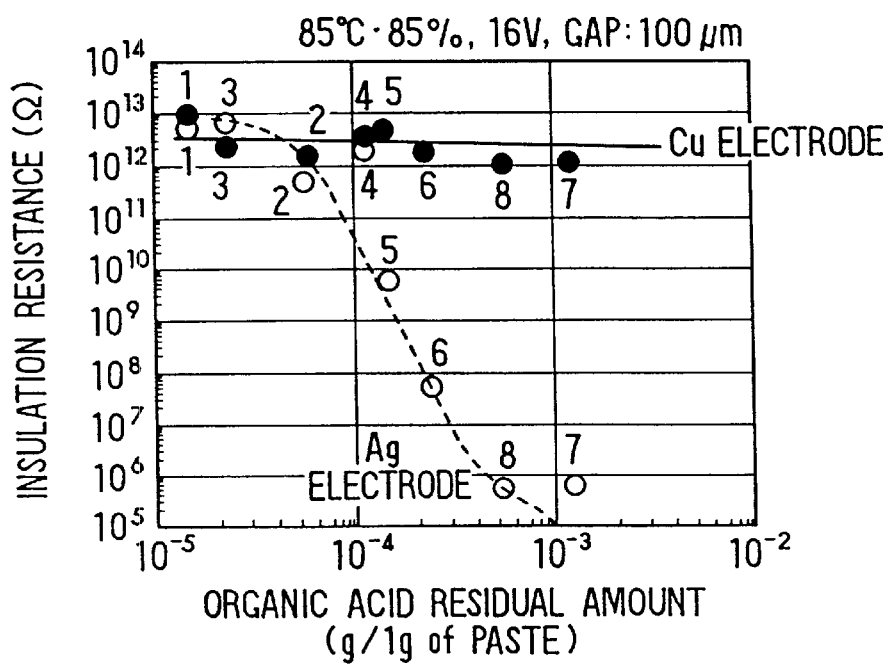
FIG. 9 is a graph showing insulation resistances after 500 hours relative to the residual amount of the organic acid.

Among the above-mentioned organic acids, p-methylbenzoic acid (toluic acid) is used for paste. FIG. 8 shows a relationship of a residual amount of organic acid (grams per 1 gram of paste) relative to an evaporation temperature (temperature at TG%=0%). In FIG. 8, numerals are those (types of organic acids) shown in Table 1. FIG. 9 shows a relationship of the residual amount of organic acid and an insulation resistance, which is measured after 500 hours, in two cases where Ag and Cu are used as electrode materials. In FIG. 9, likewise, numerals are those (types of organic acids) shown in Table 1. The residual amount of organic acid is a value obtained by measuring the organic acid extracted from the substrate after reflow by gas chromatography (GC).

For example, when the reflow peak temperature is approximately 230° C., as shown in FIG. 8, the lower the temperature at TG%=0% becomes, the lower the absolute residual amount of organic acid becomes. Further, as shown in FIG. 9, when the absolute residual amount of the organic acid is low and the Ag electrode is used under conditions requiring higher insulation reliability, benzoic acid (No. 1 in FIGS. 8 and 9) provides good insulation reliability. Besides benzoic acid, p-methylbenzoic acid (No. 3 in FIGS. 8 and 9), o-methylbenzoic acid (No. 2 therein) and p-ethylbenzoic acid (No. 4 therein) are also effective.

As shown in FIG. 8, when the temperature of the material at TG%=0% is less than approximately 210° C., the insulation reliability can be satisfied even in case of using the Ag electrode as shown in FIG. 9. Meanwhile, material having the temperature at TG=0% is lower than approximately 180° C. is undesirable in case of using solder having a solidus temperature of approximately 180° C. This is because activity disappears before the solder is fused, so that its reducibility is not exhibited so much and wettability is decreased.

Accordingly, a preferable material as the activator is organic acid having a temperature at TG%=0% which is higher than the solidus temperature of the soldering powder and lower than approximately 210° C. A reflow peak temperature approximately higher than 230° C. is not problematic to the Cu electrode. Further, as shown in FIG. 9, when the Ag electrode is employed, it is preferable that the amount of the organic acid remaining in the residue on the soldered substrate is $2 \times 10^{-4}$ g or less, especially, $8 \times 10^{-5}$ g or less per 1 gram of the paste.

Herebelow, optimum conditions concerning selection of materials and the like are described below.

TABLE 2

| | Paste composition | | |
|---|---|---|---|
| No. | Alcohol base (%) | Activator (%) | Inactive material (viscosity controlling component, etc.) (%) |
| 1 | 70 | 5 | 25 |
| 2 | 87 | 3 | 10 |
| 3 | 85 | 5 | 10 |
| 4 | 92 | 2 | 6 |
| 5 | 40 | 7 | 53 |
| 6 | 55 | 5 | 40 |

First, specific mixing ratios of the paste (paste composition) among the base, the activator, and inactive materials such as viscosity controlling component are described. Examples of the paste compositions which are confirmed those effectiveness are shown in Table 2 in which % means weight %.

The alcohol base is formed into paste at a ratio of from approximately 30% to 95% when the activator is added at approximately 5%, and its effect has been already identified. Basically, it is effective that the amount of the alcohol base is excessive as compared to that of the activator. That is, it is effective that the amount of the alcohol base is at least two times larger than that of the activator.

The amount of the viscosity controlling component capable of decreasing wettability is described next. When approximately 10% of the alcohol base was replaced with inactive viscosity controlling component, the wettability was notably decreased. Meanwhile, unless the viscosity controlling component was added at least at a ratio of approximately 10%, the printability was not improved satisfactorily. It was further found that the activity was recovered by adding monobasic organic acid at approximately 5% when the viscosity controlling component (or the inactive component) was added at approximately 10% or more and reduced the wettability.

The optimum organic acid has the following features. First, monobasic organic acid is preferable for the activator. Further, aromatic organic acid (hydrophobic organic acid which is less dissolved in water) is preferable. Still further, it is required that the organic acid can be esterified with TMP (alcohol base) to produce ester which is not hydrolyzed under usage conditions of 85° C. and 85%.

Accordingly, the present embodiment has the following characteristics.

The surface-mounted type electronic device has the electronic component soldered to the electrodes on the ceramic substrate by the soldering paste including polyhydric alcohol as a base of flux and organic acid as an activator of the flux, and mixed with the metallic powder. The organic acid added to the soldering paste as the activator improves the wettability and the continuous printability. Further, the metallic powder functions as a catalyst during the soldering reflow to facilitate esterification of the organic acid and the alcohol in the soldering paste, thereby producing ester. The ester incorporates therein the organic acid and the metal salt as the reaction product. Consequently, the insulation property is improved. Therefore, even when an additive for increasing the printability is added, the insulation property and the wettability can be maintained at predetermined levels without being lowered.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A soldering paste comprising:
    a flux comprising an alcohol as a base and an organic acid as an activator, wherein the alcohol is selected from the group consisting of trimethylolpropane and trimethylolethane and wherein the organic acid is an aromatic compound;
    a metallic powder mixed with the flux,
    wherein the organic acid reacts with the alcohol to produce an ester when the metallic powder is fused.

2. The soldering paste of claim 1, wherein the organic acid is at least one selected from a group consisting of benzoic acid, o-methylbenzoic acid, p-methylbenzoic acid, p-ethylbenzoic acid, 2-ethoxybenzoic acid, p-tert-butylbenzoic acid, 4-n-hexylbenzoic acid, 1-naphthoic acid, 2,4,6-trimethylbenzoic acid, and m-methylbenzoic acid.

3. The soldering paste of claim 1, wherein the organic acid has a temperature at which a weight % thereof is approximately 0% in a measurement by a thermal gravimetry method carried out at a gas flow rate of 200 ml/min and a temperature rise rate of 10° C./min, the temperature being higher than a solidus temperature of the metallic powder and lower than a reflow peak temperature.

4. The soldering paste of claim 3, wherein the reflow peak temperature is higher than approximately 230° C.

5. The soldering paste of claim 1, wherein the organic acid has a temperature at which a weight % of the organic acid is approximately 0% in a measurement by a thermal gravimetry method carried out at a gas flow rate of 200 ml/min and a temperature rise rage of 10° C./min, the temperature being higher than a solidus temperature of the metallic powder and lower than approximately 210° C.

6. The soldering paste of claim 1, wherein the metallic powder includes Sn.

7. The soldering paste of claim 1, wherein an amount of the organic acid remaining in the soldering paste after the ester is produced is smaller than approximately $2 \times 10^{-4}$ grams per 1 gram of the soldering paste.

8. The soldering paste of claim 7, wherein the amount of the organic acid remaining in the soldering paste after the ester is produced is smaller than approximately $8 \times 10^{-5}$ grams per 1 gram of the soldering paste.

9. The soldering paste of claim 1, further comprising a material for reducing a viscosity of the soldering paste.

10. The soldering paste of claim 9, wherein the material is a volatile terpene compound.

11. A soldering method for soldering an electronic component to a base member, the method comprising:
    coating a soldering paste onto an electrode deposited on the base member, the soldering paste including alcohol selected from the group consisting of trimethylolpropane and trimethylolethane, an organic acid, and a metallic powder, the soldering paste including a material for reducing a viscosity of the soldering paste;
    depositing the electronic component on the electrode through the soldering paste; and
    performing a soldering reflow for soldering the electronic component to the electrode.

12. The soldering method of claim 11, wherein the soldering reflow is performed in a non-reductive atmosphere.

13. The soldering method of claim 11, wherein the material is a volatile terpene compound.

14. The soldering method of claim 11, wherein the organic acid reacts with the alcohol to produce an ester film on a peripheral surface of the electrode during the soldering reflow.

* * * * *